(12) United States Patent
Zhao et al.

(10) Patent No.: US 8,510,091 B1
(45) Date of Patent: Aug. 13, 2013

(54) DOMAIN DECOMPOSITION FORMULATIONS FOR SIMULATING ELECTROMAGNETIC FIELDS

(75) Inventors: Kezhong Zhao, Wexford, PA (US); Din-Kow Sun, Walnut, CA (US)

(73) Assignee: SAS IP, Inc., Cheyenne, WY (US)

( * ) Notice: Subject to any disclaimer, the term of this patent is extended or adjusted under 35 U.S.C. 154(b) by 239 days.

(21) Appl. No.: 12/878,523

(22) Filed: Sep. 9, 2010

(51) Int. Cl.
*G06F 17/50* (2006.01)

(52) U.S. Cl.
USPC .................. 703/13; 703/2; 343/767; 343/786; 343/893; 343/840; 359/558; 359/642

(58) Field of Classification Search
None
See application file for complete search history.

(56) References Cited

U.S. PATENT DOCUMENTS

| | | | |
|---|---|---|---|
| 5,553,097 | A | 9/1996 | Dagher |
| 6,349,272 | B1 | 2/2002 | Phillips |
| 6,675,137 | B1 | 1/2004 | Toprac et al. |
| 8,245,165 | B1 | 8/2012 | Tiwary et al. |
| 2011/0010410 | A1 | 1/2011 | DeLaquil et al. |
| 2011/0218789 | A1 | 9/2011 | Van Beurden |

OTHER PUBLICATIONS

Ahen Peng, Jin-Fa Lee Non-conformal domain decomposition method with second-order transmission conditions for time-harmonic electromagnetics, Journal of Computational Physics 229, Apr. 10, 2010, pp. 5615-5629.*
Kezhong Zhao, Vineet Rawat, Seung-Cheol Lee, Jin-Fa Lee A Domain Decomposition Method With Nonconformal Meshes for Finite Periodic and Semi-Periodic Structures IEEE Transactions on Antennas and Propagation, vol. 55, No. 9, Sep. 2007.*
C. T. Wolfe , U. Naysariwala, Stephen D. Gedney A Parallel Finite-Element Tearing and Interconnecting Algorithm for Solution of the Vector Wave Equation with PML Absorbing Medium IEEE Transaction on Antennas and Propagation, vol. 48, No. 2, Feb. 2000.*
Antoulas, A new result on passivity preserving model reduction, Systems & amp: Control Letters, 54(4): 361-374, Apr. 2005.
Astolfi, A new look at model reduction by moment matching for linear systems, Decision and Control, 2007 46th IEEE Conference, pp. 4361-4366, Dec. 12-14, 2007.
Antoulast A.C., On the Scalar Rational Interpolation Problem, IMA Jrl. of Mathematical Control and Information, 3:61-88 (1986).
Benner et al., Partial Realization of Descriptor Systems, Systems and Control Letters, 55(11): 929-938 (Jun. 13, 2006 preprint).
Blackburn, Fast Rational Interpolation, Reed-Solomon Decoding, and the Linear Complexity Profiles of Sequences, IEEE Transactions on Information Theory, 43(2): 537-548 (Mar. 1997).
Bracken et al, S-Domain Methods for Simultaneous Time and Frequency Characterization of Electromagnetic Devices, IEEE Transaction on Microwave Theory and Techniques, 46(9): 1277-1290 (1998).
Cai et al, Displacement Structure of Weighted Pseudoinverses, Applied Mathematics and Computation, -153(2):317-335 (Jun. 4, 2004).

(Continued)

*Primary Examiner* — Saif Alhija
*Assistant Examiner* — Cuong Luu
(74) *Attorney, Agent, or Firm* — Goodwin Procter LLP; Steven A. Moore (57) ABSTRACT

Disclosed are domain-decomposition approaches to simulations of electromagnetic fields may that, in various embodiments, use second-order Robin transmission conditions at subdomain boundaries.

21 Claims, 6 Drawing Sheets

(56) References Cited

OTHER PUBLICATIONS

Chen, et al, Per-Unite-Length RLGC Extraction Using a Lumped Port De-Embedding Method for Application on Periodically Loaded Transmission Lines, 2006 Electronic Components and Technology Conference, pp. 1770-1775.

Degerstrom et al, Accurate Resistance, Inductance, Capacitance, and Conductance (RLCG) From Uniform Transmission Line Measurements, Proceedings of the 16th Topical Meeting on Electrical Performance of Electronic Packaging, Oct. 2008, pp. 77-80.

Eisenstadt et al, S-Parameter-Based IC Interconnect Transmission Line Characterization, IEEE Transactions on Components, Hybrids, and Manufacturing Technology, 15(4): 483-490 (Aug. 1992).

Fitzpatrick, On the Scalar Rational Interpolation Problems, Math, Control Signals Systems, 9:352-369 (1996).

Gallivan et al, Model Reduction of MIMO Systems via Tangential Interpolation, SIAM J. Matris Anal. Appl., 26(2):328-349 (2004).

Gallivan et al, Model reduction via tangental interpolation, MTNS2002 (15th Symp. on the Mathematical Theory of Networks and Systems) (2002) 6 pages.

Gallivan et al, Model Reduction via Trancation: An Interpolation Point of View, Linear Algebra and Its Applications, 375:115-134 (2003).

Gruodis, et al, Coupled Lossy Transmission Line Charaterization and Simulation, IBM J. Res. Develp., 25(1):25-41 (Jan. 1981).

Han et al, Frequency-Dependent RLGC Extraction for a Pair of Coupled Transmission Lines Using Measure Four-Port S-Parameters, 63rd ARTFG Conference Digest, Jun. 2004, pp. 211-219.

Hill et al, Crosstalk Between Microstrip Transmission Lines, IEEE Transactions on Electromagnetic Compatability, 36(4):314-321 (Nov. 1994).

Hipimair, Symmetric Coupling for Eddy Current Problems, SIAM J. Numer. Anal. 40(1):41-65 (2002).

Karam, Computation of the One-Dimensional Unwrapped Phase, Massachusetts Institute of Technology Thesis, Jan. 2006, 101 pages.

Kim et al, Implementation of Broadband Transmission Line Models with Accurate Low Frequency response for High-SPeed System Simulations, DesignCon 2006, 25 pages.

Kiziloglu et al, Experimental Analysis of Transmission Line Parameters in High-Speed GaAs Digital Circuit Interconnects, IEEE Transactions on Microwave Theory and Techniques, 39(*8):1361-1367 (Aug. 1991).

Knockaert et al, Recovering Lossy Multicondictor Transmission Line Parameters From Impedance or Scattering Representations, Proceedings of the 10th Topical Meeting on Electrical Performance of Electronic Packaging, Cambridge, MA, Oct. 2001, pp. 35-38.

Knockaert et al, Recovering Lossy Multiconductor Trnasmission Line Parameters From Ipedance or Scattering Representations, IEEE Transactions on Advanced Packaging, 25(2):200-205 (May 2002).

Laigaudi et al, Accurate Transient Simulation of Interconnects Characterization by Band-Limited Data With Propagation Delay Enforcement in a Modified Nodal Analysis Framework, IEEE Transaction on Electromagnetic Compatability 50(3):715-729 (Aug. 2008).

Lee et al, A Non-Overlapping Domain Decomposition Method with Non-Matching Grids for Modeling Large Finite Antenna Arrays, J. Comput. Phys., 203:1-21 (Feb. 2005).

Lefteriu et al, Modeling Multi-Port Systems from Frequency Response Data via Tangential Interpolation, *IEEE*, 4 pages (2009).

Leung et al, Characterization and Attenuation Mechanism of CMOS-Compatible Micromachined Edge-Suspended Coplanar Waveguides on Low-Resistivity Silicon Substrate, IEEE Transactions on Advanced Packaging, 29(3):496-503 (Aug. 2006).

Li et al, Model Order Reduction of Linear Networks with Massive Ports via Frequency-Dependent Port Packing, 2006 43rd ACM/IEEE Design Automation Conference, pp. 267-272 (2006).

Narita et al, An Accurate Experimental Method for Characterizing Transmission Lines Embedded in Multilayer Printed Circuit Boards, IEEE Transactions on Advanced Packaging, 29(1):114-121 (Feb. 2006).

Oh et al, Improved Method for Characterizing Transmission Lines Using Frequency-Domain Measurements, Proceedings of the 13th Topical Meeting on Electrical Performance of Electronic Packaging, pp. 127-130 (Jul. 2004).

Sampath, On Addressing the Practical Issues in the Extraction of RLGC Parameters for Lossy Multiconductor Transmission Lines Using the S-Parameter Models, Proceedings of the 16th Topical Meeting on the Electrical Performance of Electronic Packaging, pp. 259-262 (Oct. 2008).

Scharma, Approximate Identification and Control Design with Application to a Mechanical System, Delft University of Technology, Thesis, 294 pages (1992).

Vandendorpe, Model Reduction of Linear Systems, and Interpolation Point of View, Univ. Catholique de Louvain, Center for Systems Engineering and Applied Mechanics, 162 pages (Dec. 1, 2004).

Woracek, Multiple Point Interpolation in Nevanlinna Ciasses, Integral Equations and Operator Theory, 28(1):97-109, (Mar. 1997).

Al-Nashi, Phase unwrapping of digital signals, 1989, IEEE Transactions on Acoustics, Speech, and Signal Processing, 37(11):1693-1702.

Karam et al., Computation of the One-Dimensional Unwrapped Phase, 2007, Proceedings of the 2007 15th International Conference on Digital Signal Processing, pp. 304-307.

Tribolet, J., A new phase unwrapping algorithm, 1977, IEEE Transactions on Acoustics, Speech, and Signal Processing,ASSP-25(2):170-177.

Tripathi et al., A SPICE model for multiple coupled microstrips and other transmission lines, 1985, IEEE Transactions on Microwave Theory and Techniques, MTT-33(12):1513-1518.

Hebermehl et al, Improved numerical methods for the simulation of microwave circuits, 1997, Weierstrass Institute for Applied Analysis and Stochastics, pp. 1-14.

Gutknecht, Block Krylov Space Methods for Linear Systems with Multiple Right-hand sides: An Introduction, pp. 1-22, 2006.

Badics et al, A Newton-Raphson Algorithm With Adaptive Accuracy Control Based on a Block-Preconditioned Conjugate Gradient Technique, pp. 1652-1655, 2005.

Mayo et al., A Framework for the Solution of the Generalized Realization Problem, Linear algebra and its applications 425.2 (2007):634-662.

\* cited by examiner

DOMAIN DECOMPOSITION FORMULATIONS FOR SIMULATING ELECTROMAGNETIC FIELDS

FIELD OF THE INVENTION

The present invention relates to systems and methods for the simulation of electromagnetic fields, and in particular, to domain decomposition approaches to simulation.

BACKGROUND

Physical fields can often be simulated over a user-defined domain—e.g., a surface or volume specified geometrically—by "discretizing" the domain (i.e., dividing it into discrete elements), and modeling the field-governing equations and applicable boundary conditions with a system matrix equation, i.e., a (typically large) linear system of equations that describe the behavior of the field within the discretized domain. For example, electromagnetic fields can be simulated using a discretized formulation of Maxwell's equations. To set up the matrix equation, the finite element method (FEM) is widely used because of its ability to model complex heterogeneous and anisotropic materials and to represent geometrically complicated domains using, for example, tetrahedral elements. FEM is a numerical technique for finding approximate solutions of partial differential equations (such as, e.g., Maxwell's equations), i.e., a technique that enables problems lacking exact mathematical ("analytical") solutions to be approximated computationally ("numerically").

In brief, FEM typically involves representing a surface or spatial volume as many small component elements. This discretization may be accomplished by defining a mesh grid (such as, e.g., a triangular, tetrahedral, or other polygonal mesh) over the domain. The physical fields (e.g., the components of electric and magnetic fields) may then be expressed in a form suitable to the discretized domain. For example, fields may be represented in a finite-dimensional function space of piecewise polynomial functions (e.g., piecewise linear functions) that can be described as linear combinations of basis functions, or "finite elements," whose "support"—defined as the portion of the domain where the basis functions are non-zero—includes only a small number of adjacent meshes. The boundary value problem that describes the behavior of the fields in the domain (i.e., the field-governing equations and boundary conditions) is typically rephrased in its weak, or variational, form before discretization.

FEM results in a matrix equation which may then be solved with a direct or iterative solver, depending on the size and characteristics of the linear system. (A "solver," as the term is used herein, denotes a method for solving a system of equations, or a computer program implementing such a method, as determined by context.) For large three-dimensional problems, direct solvers potentially require prohibitive amounts of memory and suffer poor parallel scalability. Therefore, iterative solvers typically present the only practical means for solving large systems. In iterative methods, the problem is approached in successive steps, with each step refining a previous approximation to more closely approach the exact solution. A preconditioner (i.e., a matrix that reduces the "condition number" of the problem, which, in turn, is a metric of the propagation of approximation errors during numerical solution) is often applied to the original system matrix to increase the rate of convergence toward the solution—i.e., to reduce the number of necessary iterations.

A powerful technique to facilitate parallel solution of large electromagnetic problems, which also provides an efficient and effective preconditioner, is the domain decomposition method (DDM). In this method, the original domain of the problem is decomposed into several (usually non-overlapping and possibly repetitive) subdomains; for example, a cuboid spatial domain may be divided into a series of smaller adjacent cubes. The continuity of electromagnetic fields at the interfaces between adjacent subdomains is enforced through suitable boundary conditions (also referred to as transmission conditions), which are preferably chosen so as to avoid mathematical complication (e.g., so that modeling of each subdomain involves a "well-posed" problem having an unambiguous solution, and such that convergence occurs rapidly enough to be computationally tractable).

For problems involving electromagnetic fields (or, more generally, vector wave problems), it has been shown that subdomain problems are well-posed and convergence occurs at an acceptable rate if so-called "Robin transmission conditions" are imposed on the boundaries between subdomains. The subdomain boundaries do not represent actual physical boundaries, and are introduced merely for computational convenience. Transmission conditions specify how the fields behave at those "virtual boundaries" to ensure that the solution obtained by domain decomposition is consistent with a solution for the undivided domain (i.e., a problem formulation wherein the boundaries do not exist). For example, transmission conditions may specify that the fields, or their derivatives, are continuous across the boundary. Robin transmission conditions express these requirements in terms of particular combinations of fields, currents, and their derivatives. First-order Robin transmission conditions have been successfully used in antenna-array-type problems, but have generally proven unsuitable for other problem categories because they damp only propagation errors, but not evanescent errors. Attempts to use higher-order Robin transmission conditions, on the other hand, have suffered from poor convergence properties, resulting from the high sensitivity of the convergence rate to the particular choice of certain coefficients contained in the conditions, hereinafter referred to as "Robin coefficients."

Accordingly, there is a need for electromagnetic simulation methods that achieve high convergence rates for the simulated electromagnetic field across a broad range of applications. In particular, there is a need for DDMs that employ optimized Robin transmission conditions.

SUMMARY

The present invention provides systems and methods for simulating electromagnetic fields—in particular, measurable properties of the magnetic and/or electrical fields, e.g., the field amplitudes and phases and/or their variation over time—in user-defined domains. The user-defined domains generally correspond to one, two-, or three-dimensional regions of physical objects in which electromagnetic fields are of interest. For example, a user-defined domain may represent the surface of an airplane whose radar cross-section is to be determined, a three-dimensional region of an electromechanical system designed to produce certain forces and torques, the interior of particle traps or accelerators used in research, and electrical, electronic, or optical structures (including, sometimes, the air space around them) to be optimized for energy or signal transmission or other purposes. The simulated electromagnetic field may inform the design of devices and structures subject to electromagnetic fields, and may (but need not) be represented graphically, or in another intuitive way, to provide insight into the interaction of the field with the physical object and/or its affect on other physical properties (e.g., mechanical stresses or temperature distributions).

In various embodiments, the simulation of electromagnetic fields is based on domain decomposition and the use of higher-order (e.g., second-order) Robin transmission conditions to model the continuity of the fields at subdomain boundaries. Employing higher-order Robin transmission conditions renders the simulation methods suitable for many applications that are not amenable to simulation using first-order Robin conditions. The Robin transmission conditions may be optimized for fast convergence of the simulated fields, e.g., by selecting suitable values for the Robin coefficients. In certain embodiments, the Robin coefficients are based on the mesh size, the frequency of the electromagnetic fields, and the basis order of the finite elements used to model the field.

In some embodiments, the electromagnetic fields are simulated using a system matrix whose entries (i,j) describe the interactions between the i'th and j'th finite element basis functions. The system matrix may have block form, each diagonal block corresponding to a particular subdomain, and off-diagonal blocks representing couplings between the subdomains. The system matrix may be set up such that the diagonal blocks have a block lower triangular form whose diagonal sub-blocks are symmetric. Advantageously, this results in reduced memory requirements for computer systems implementing the simulation method. A domain-decomposition formulation with block lower triangular subdomain matrices may be achieved by exploiting degrees of freedom in a model of the electromagnetic field, e.g., by substituting a surface integral in the variational form of Maxwell's equations using the Robin transmission conditions.

Accordingly, in a first aspect, the present invention provides a method for simulating an electromagnetic field in a user-defined domain. (Simulations of electromagnetic fields are meant to encompass simulations of electric field components, magnetic field components, or both, reflecting that, if all electric field components are known for a particular problem, the corresponding magnetic field components can readily be computed using Maxwell's equations, without any need for additional simulations.) The method includes decomposing the user-defined domain into a plurality of subdomains (which may be done be the user, but is typically accomplished automatically), modeling the electromagnetic field within the plurality of subdomains using higher-order Robin transmission conditions (e.g., second-order conditions) at interfaces between the subdomains, and simulating the electromagnetic field in the domain based on the model. The Robin transmission conditions comprise Robin coefficients selected such that the simulated electromagnetic field converges at a high rate (e.g., at a rate that is twice or four times that of an otherwise similar simulation using first-order Robin conditions). The Robin coefficients may be selected based (at least in part) on one or more material properties associated with the interfaces and/or on the free-space wave number of the electromagnetic fields. The method may further include graphically representing the simulated electromagnetic field on a display.

In some embodiments, modeling the electromagnetic field involves generating a block system matrix, which may have block lower triangular form. The electromagnetic field may then be simulated by iteratively solving an equation comprising the block system matrix. A modified Gauss-Seidel preconditioner may be applied to the block system matrix before solving the equation. In certain embodiments, the equation for the block system matrix is solved by solving matrix equations for the subdomains (each including the diagonal block matrix corresponding to the respective subdomain) in parallel.

Generating the block system matrix may involve discretizing a variational form of the model using finite elements defined over mesh grids of the subdomains. The Robin coefficients may be selected based (at least in part) on the discretization, and may scale with the mesh size of the mesh grids. In certain embodiments, the Robin coefficients are based (at least in part) on a basis order of the finite elements, e.g., via two basis-order-dependent constants. If the finite elements are selected from first-order and second-order basis functions, the basis-order-dependent constants of the Robin coefficients may each be selected to be about 0.5. If the finite elements are third-order basis functions, the two basis-order-dependent constants may be selected to be about 0.25 and about 1.0, respectively.

In another aspect, the invention is directed to a method for simulating an electromagnetic field in a user-defined domain by decomposing the user-defined domain into a plurality of subdomains, modeling the electromagnetic field within the plurality of subdomains, and—based on the model—generating a block system matrix whose diagonal blocks correspond to the subdomains and wherein each diagonal block has block lower triangular form. The electromagnetic field is then be simulated based (at least in part) on the block system matrix, and the simulated field is, optionally, represented graphically on a display. Generating the block system matrix may include discretizing a variational form of the model using finite elements defined over mesh grids of the subdomains, e.g., by substituting a surface integral in the variational form using Robin transmission conditions.

In yet another aspect, the invention provides a computer system for simulating an electromagnetic field in a user-defined domain. The system includes a memory for storing parameters representative of the electromagnetic field and the user-defined domain. Further, the system includes an analysis module for decomposing the user-defined domain into a plurality of subdomains, modeling the electromagnetic field within the plurality of subdomains using higher-order Robin transmission conditions at interfaces between the subdomains, generating (based on the model) a block system matrix system matrix whose diagonal blocks correspond to the subdomains and each have block lower triangular form, and simulating the electromagnetic field based (at least partially) on the block system matrix.

BRIEF DESCRIPTION OF THE DRAWINGS

The foregoing will be more readily understood from the following detailed description in conjunction with the drawings, in which.

DETAILED DESCRIPTION

Figure 1:
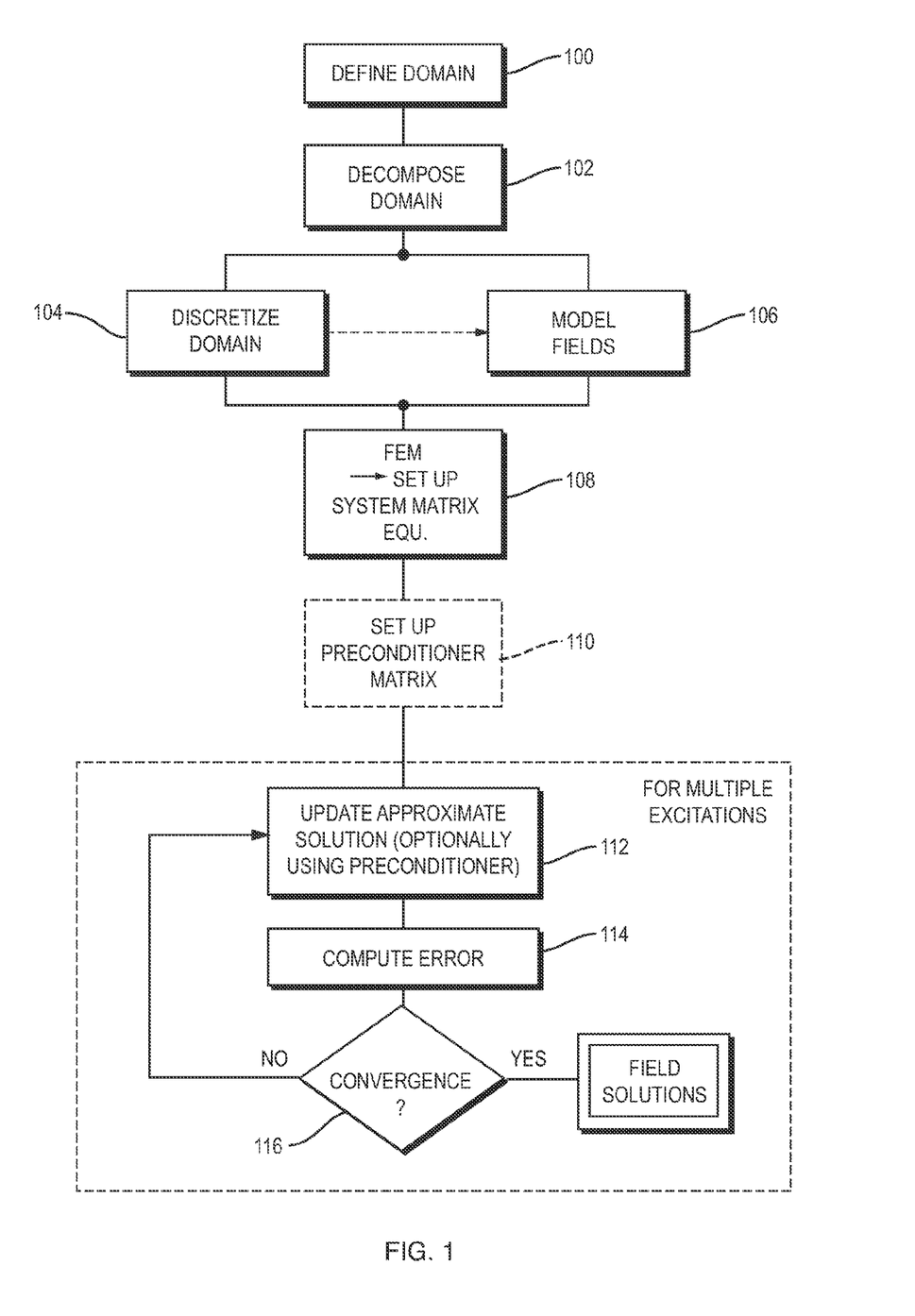
FIG. 1 is a flow chart illustrating a method for simulating physical fields in accordance with various embodiments.

Various embodiments of the present invention relate to the simulation of electromagnetic fields in user-defined domains and, more particularly, to domain-decomposition-based finite element methods. FIG. 1 provides an overview over the simulation process in form of a flow chart. The method begins with the definition of the domain of interest (step 100) by the user, and the decomposition of that domain into multiple subdomains (step 102). In preferred embodiments, the decomposition into subdomains is accomplished automatically, without human intervention, using, e.g., a software module. The subdomains are then discretized into many elements (step 104), which, collectively, cover the subdomains. A two-dimensional domain or subdomain (i.e., a surface), for example, may be "meshed" into polygonal (e.g., triangular or quadrilateral) elements. However, discretizations that result in elements with curved edges are also possible. A three-dimensional (sub-)domain may, for example, be divided into tetrahedral elements; again, elements with curved faces may be used as well. The subdomains may or may not overlap. If two subdomains overlap, their discretizations need to conform (i.e., be the same) in the overlap region. This requirement generally poses constraints on the type and scale of discretization used. Since non-overlapping domain decomposition are not subject to such constraints, they, advantageously, facilitate independent meshing of the various subdomains. Preferred embodiments, therefore, utilize non-overlapping domain decomposition. It should be understood, however, that the techniques and improvements to which various aspects of the instant invention are directed are generally applicable to both overlapping and non-overlapping DDMs, and that the scope of the invention is, accordingly, not limited to non-overlapping DDMs.

In step 106, the electric and magnetic fields in the user-defined domain, and associated electric currents, are modeled by formulating Maxwell's equations for each subdomain, and providing boundary conditions (also referred to as transmission conditions) at the interfaces between subdomains. Together, the bulk equations (i.e., the equations applicable to the interior of the domain) and the boundary equations define a boundary value problem. Transmission conditions are designed to "undo" the effect of the artificial (i.e., non-physical) division of the domain into multiple subdomains, and to ensure the mutual consistency of the field solutions for the various subdomains. In particular, transmission conditions are intended to guarantee the continuity of the fields across the subdomain boundaries, which, in practice, is usually accomplished only in approximation. The choice of transmission conditions significantly affects both the accuracy of the simulation and the computational cost associated with it. Choosing transmission conditions involves selecting a particular type of conditions, as well as specifying values for parameters of the conditions. In certain embodiments, second-order Robin-type transmission conditions are used, and the Robin coefficients contained therein are set so as to improve or optimize the convergence properties of the simulation, as further described below.

In step 108, the field-modeling equations are discretized over the discretized domain, using a finite element method as known to persons of skill in the art. This involves rephrasing the boundary value problem in its variational form, and expanding the fields in terms of piecewise polynomial basis functions, each of which is non-zero in, typically, only a small number of contiguous elements of the domain. (The term "fields" denotes, in this context, the entirety of physical-field quantities to be obtained directly (as opposed to indirectly via post-processing of simulated fields) by the simulation, i.e., the electric and/or magnetic fields as well as the currents.) The result is a matrix equation of the form $A\bar{x}=\bar{b}$, in which the solution vector $\bar{x}$ specifies the values of the field components (in terms of the amplitudes of the basis functions), and the system matrix $A$ and excitation vector $\bar{b}$ together characterize the physical properties of the domain in conjunction with the field-governing equations. The excitation vector $\bar{b}$ contains information about the sources and sinks of the fields (e.g., electrical charges) as well as about constraints imposed on the boundaries (e.g., a particular electric potential at the surface). The dimensionality of the system matrix and the solution and excitation vectors is the number of basis functions, or finite elements. The system matrix $A$ generally has block form. For example, for the case of two subdomains, it takes the form:

$$A = \begin{bmatrix} K_1 & -G_{12} \\ -G_{12} & K_2 \end{bmatrix},$$

where the diagonal blocks $K_i$ correspond to the individual subdomains $\Omega_i$, and off-diagonal blocks $-G_{ij}$ correspond to couplings between the subdomains. In certain embodiments, the diagonal blocks (or submatrices) themselves are block lower triangular matrices, whose diagonal sub-blocks are symmetric if there are no non-reciprocal material properties involved.

The matrix equation resulting from discretization of the boundary value problem is solved iteratively for one or more excitations (characterized by corresponding excitation vectors $\bar{b}$). Often, this iterative process involves preconditioning the system matrix, typically via one or more matrix operations, to achieve improved numerical properties, such as, e.g., a better condition number. In a general sense, DDM can be conceived as block generalization of classical preconditioners, such as Jacobi and Gauss-Seidel preconditioners. Since the convergence of such classical preconditioners relies heavily on the spectral radius of the "iteration" matrix, i.e., the preconditioned system matrix, the role of a "successful" transmission condition is thus to minimize the spectral radius. In some embodiments, an additional preconditioner that advantageously combines Gauss-Seidel-type and Jacobi-type preconditioning (as explained in more detail below) is set up in step 110, and subsequently used during the iterative solution.

The iterative solution of the (optionally preconditioned) system matrix equation involves approximating the solution vector $\bar{x}$ (the initial approximation typically being a guess) (step 112), applying the system matrix to determine an error associated with the approximation (step 114), evaluating the error against a threshold or applying a similar convergence criterion (step 116), and refining the approximation of $\bar{x}$ if (and only if) the convergence criterion is not satisfied. For example, consider a system matrix equation based on domain-decomposition, which may be written as:

$$\begin{bmatrix} K_1 & -G_{12} \\ -G_{21} & K_2 \end{bmatrix} \begin{bmatrix} \bar{u}_1 \\ \bar{u}_2 \end{bmatrix} = \begin{bmatrix} \bar{y}_1 \\ \bar{y}_2 \end{bmatrix} \text{ with } \bar{x} = \begin{bmatrix} \bar{u}_1 \\ \bar{u}_2 \end{bmatrix} \text{ and } \bar{b} = \begin{bmatrix} \bar{y}_1 \\ \bar{y}_2 \end{bmatrix},$$

where $\bar{u}_i$ and $\bar{y}_i$ are the solution vectors and excitations of the subdomains, respectively. This equation may be solved using Jacobi iterations:

$$\begin{bmatrix} K_1 & 0 \\ 0 & K_2 \end{bmatrix} \begin{bmatrix} \bar{u}_1 \\ \bar{u}_2 \end{bmatrix}^{(n)} = \begin{bmatrix} \bar{y}_1 \\ \bar{y}_2 \end{bmatrix} + \begin{bmatrix} 0 & G_{12} \\ G_{21} & 0 \end{bmatrix} \begin{bmatrix} \bar{u}_1 \\ \bar{u}_2 \end{bmatrix}^{(n-1)}$$

$$\begin{bmatrix} \bar{u}_1 \\ \bar{u}_2 \end{bmatrix}^{(n)} = \begin{bmatrix} K_1 & 0 \\ 0 & K_2 \end{bmatrix}^{-1} \begin{bmatrix} \bar{y}_1 \\ \bar{y}_2 \end{bmatrix} + \begin{bmatrix} K_1 & 0 \\ 0 & K_2 \end{bmatrix}^{-1} \begin{bmatrix} 0 & G_{12} \\ G_{21} & 0 \end{bmatrix} \begin{bmatrix} \bar{u}_1 \\ \bar{u}_2 \end{bmatrix}^{(n-1)},$$

where n denotes the iteration number of the iterative solution process. To initialize the approximate solution (step 112), $\bar{u}_1^{(-1)}$ and $\bar{u}_2^{(-1)}$ may be set to zero, resulting in $\bar{u}_1^{(0)} = K_1^{-1} \bar{y}_1$ and $\bar{u}_2^{(0)} = K_2^{-1} \bar{y}_2$. This initial solution may then be updated iteratively according to:

$$\bar{u}_1^{(n)} = \bar{u}_1^{(0)} + K_1^{-1} G_{12} \bar{u}_2^{(n-1)}$$

$$\bar{u}_2^{(n)} = \bar{u}_2^{(0)} + K_2^{-1} G_{21} \bar{u}_1^{(n-1)}.$$

This requires calculating, for each iteration, the error (or "correction vector") $\bar{r}_i^{(n)} = K_i^{-1} G_{ij} \bar{u}_j^{(n-1)}$ (step 114), which may, in turn, be accomplished by a direct or an iterative solver. Steps 112, 114, 116 are typically repeated many times before the solution vector has converged according to the convergence criterion.

In some embodiments, a Krylov subspace method (explained below) is used to iteratively solve the matrix equation. If the equation needs to be solved for multiple excitation vectors $\bar{b}$, the iteration process may be carried out for each excitation separately. This may be accomplished in parallel, using as many processors as there are excitations. However, this approach would preclude parallelizing the solution of each individual matrix equation, as is done in DDMs. In an alternative approach, which is consistent with DDM, solution vectors for some or all excitations may be computed together (or "simultaneously") by interposing, between sequential iterations for one excitation, iterations for other excitations. In certain embodiments, the simultaneous solution of the matrix equation for multiple excitations is accomplished with a modified Krylov method, explained in detail below, that exploits synergies to achieve convergence of the solution vectors for multiple excitations in fewer iterations than would be required to solve the equations individually for the different excitations.

Various aspects of the invention are directed to different steps of the method outlined above. These aspects may be employed individually and independently of one another, or in combination, and each of them may contribute to a performance improvement of electromagnetic simulations as described herein. In certain embodiments, several inventive features are utilized together, and result in an aggregate performance enhancement. However, the scope of certain aspects of the invention is generally not limited to the method illustrated in FIG. 1, or to electromagnetic simulations. For example, matrix preconditioning may generally be utilized in simulations of any system amenable to description in the form of a matrix equation, and simultaneous solutions of matrix equations for multiple right-hand sides $\bar{b}$ may be employed in many problems where the response of a system to multiple excitations is of interest. The following sections describe various aspects and embodiments of the invention in more detail.

1. Domain-decomposition Formulation of Electromagnetic Boundary Value Problems

Figure 2:
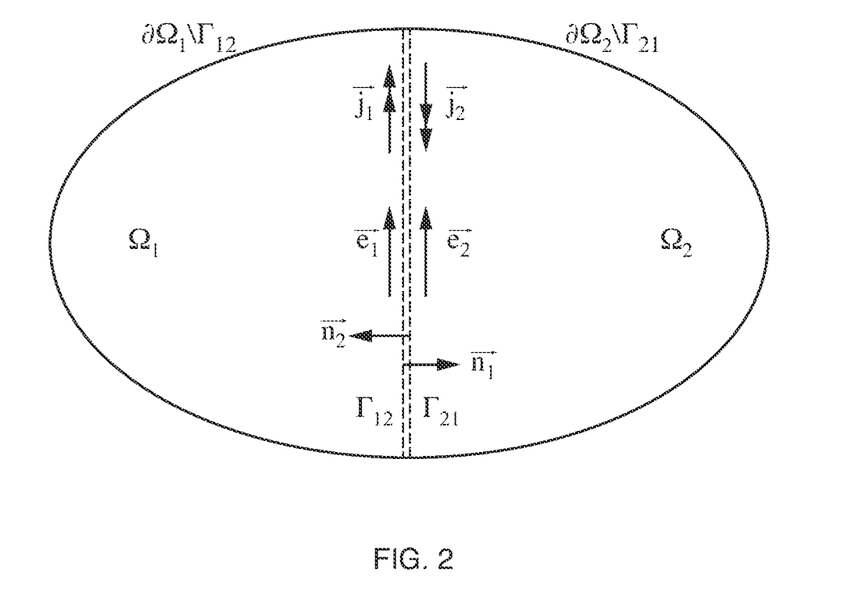
FIG. 2 is a diagram illustrating decomposition of a domain into two subdomains in accordance with one embodiment.

For illustration purposes, domain-decomposition methods in accordance with various embodiments are, in the following, described with reference to an exemplary decomposition of a domain into two non-overlapping subdomains, as shown FIG. 2. Persons of ordinary skill in the art will be able to readily generalize the described methods to an arbitrary number of subdomains, as well as to overlapping subdomains if desired. In FIG. 2, an exemplary domain $\Omega$ is decomposed into two non-overlapping subdomains $\Omega_1$ and $\Omega_2$ by an interface $\Gamma_{12} = \Gamma_{21}$. Herein, an artificial distinction is made between the coincident interfaces $\Gamma_{12}$ and $\Gamma_{21}$, which are illustrated as two dashed lines, to allow for different meshing at either side of the interface. The boundary of $\Omega_i$ (with i=1 or 2) is denoted by $\partial\Omega_i$, and includes the common interface $\Gamma_{ij}$ (with i≠j) and a portion of the external boundary of $\Omega_i$, denoted by $\partial\Omega_i \backslash \Gamma_{ij}$. In general, the domain may be partitioned into N domains:

$$\Omega = \bigcup_{i=1,N} \Omega_i, \, \Omega_i \cap \Omega_j = \phi, \, 1 \le i \ne j \le N.$$

The boundary value problem for the two domains may be formulated using time-harmonic Maxwell's equations for the interior of the subdomains:

$$\nabla \times \frac{1}{\mu_{r1}} \nabla \times \vec{E}_1 - k_0^2 \varepsilon_{r1} \vec{E}_1 = -jk_0\eta \vec{J}_1^{imp} \text{ in } \Omega_1$$

$$\nabla \times \frac{1}{\mu_{r2}} \nabla \times \vec{E}_2 - k_0^2 \varepsilon_{r2} \vec{E}_2 = -jk_0\eta \vec{J}_2^{imp} \text{ in } \Omega_2;$$

first-order absorbing boundary conditions at the exterior surfaces (also called the "truncation boundaries"):

$$\vec{j}_1 + jk_1 \vec{e}_1 0, \text{ on } \partial\Omega_1 \backslash \Gamma_{12}$$

$$\vec{j}_2 + jk_2 \vec{e}_2 0, \text{ on } \partial\Omega_2 \backslash \Gamma_{21};$$

and second-order Robin-type transmission conditions at the interface between the subdomains:

$$\vec{j}_1 + A_1 \vec{e}_1 + B_1 \overrightarrow{\text{curl}}_\Gamma \text{curl}_\Gamma \vec{e}_1 = -\vec{j}_2 + A_1 \vec{e}_2 + B_1 \overrightarrow{\text{curl}}_{64} \text{curl}_\Gamma \vec{e}_2 \text{ on } \Gamma_{12} \text{ and}$$

$$\vec{j}_2 + A_2 \vec{e}_2 + B_2 \overrightarrow{\text{curl}}_\Gamma \text{curl}_\Gamma \vec{e}_2 = -\vec{j}_1 + A_2 \vec{e}_1 + B_2 \overrightarrow{\text{curl}}_{64} \text{curl}_\Gamma \vec{e}_1 \text{ on } \Gamma_{21},$$

where $k_0$, $\eta$, $\epsilon_{ri}$, and $\mu_{ri}$ are the free-space wave number, impedance, relative permittivity, and relative permeability of the medium in $\Omega_i$, respectively. Further, $\vec{E}_i$ (i=1, 2) denotes the electric field interior to $\Omega_i$, $\vec{J}_i^{imp}$ are impressed electric currents representing near-field excitations, and $\vec{e}_i$ and $\vec{j}_i$ are tangential electric fields and surface electric currents, respectively, which may be expressed in terms of the electric field and the outward normals $\vec{n}_i$ of $\Omega_i$ according to:

$$\vec{e}_i = \vec{n}_i \times \vec{E}_i \times \vec{n}_i, \, \vec{j}_i = \frac{1}{\mu_{ri}} \nabla \times \vec{E}_i \times \vec{n}_i, .$$

The surface scalar curl, $\text{curl}_\Gamma \vec{A}$, and the surface vector curl, $\vec{\text{curl}}_\Gamma q$, are defined as:

$$\text{curl}_\Gamma \vec{A} = \frac{\partial A_x}{\partial x} - \frac{\partial A_y}{\partial y}, \quad \vec{\text{curl}}_\Gamma q = \vec{x}\frac{\partial q}{\partial y} - \vec{y}\frac{\partial q}{\partial x}.$$

The first-order absorbing boundary conditions at the truncation boundary are chosen for simplicity. The formulation described herein can, however, be readily generalized to other truncation conditions known to those of ordinary skill in the art. For example, higher order absorbing boundary conditions, perfectly matched layer conditions and exact integral equation conditions may be used.

Finally, the $A_i$ and $B_i$ are the Robin coefficients, corresponding to first-order and second-order terms, respectively, for the two subdomains. (For first-order conditions, these coefficients would reduce to $A_i = jk_i$ and $B_i = 0$.) Second-order conditions, in general, may contain different or additional second-order terms (i.e., terms that include second-order derivatives). In some embodiments, third-order or higher-order Robin-type transmission conditions are employed. Moreover, mixed-order conditions may be used, e.g., transmission conditions of different orders may be used for different subdomain interfaces.

The choice of transmission conditions may have a significant effect on the convergence properties and, thus, on the parallelizability and numerical scalability of the electromagnetic problem. For example, during the iterative solution of a problem formulated with first-order Robin-type transmission conditions, only approximation errors associated with propagating electromagnetic waves are damped, while errors associated with evanescent waves are not. As a result, the solution does not always converge with first-order Robin-type conditions if there are significant evanescent errors. When second- or higher-order Robin-type conditions are used, however, both propagating-wave and evanescent-wave errors are damped, provided that Robin coefficients are chosen appropriately.

Various embodiments of the present invention provide a systematic way of determining appropriate Robin coefficients, i.e., Robin coefficients that result in optimal or nearly optimal convergence for a given problem formulation involving second-order Robin transmission conditions. In this approach, the Robin coefficients are selected dependent on the material properties associated with the subdomain interfaces and the frequency (and, thus, free-space wave number) of the excitations. In certain embodiments, the Robin coefficients are, more specifically, expressed as:

$$A_i = \alpha_i k_0 \sqrt{\frac{\varepsilon_{ri}}{\mu_{ri}}} \text{ and } B_i = \frac{\beta_i}{k_0 \mu_{ri} \sqrt{\mu_{ri} \varepsilon_{ri}}},$$

where $\alpha_i$ and $\beta_i$ are constants for each interface between subdomains.

The Robin coefficients may further depend (e.g., via the constants $\alpha_i$ and $\beta_i$) on parameters of the discretization of the problem, such as the mesh sizes of the discretized subdomain and the basis order of the finite elements in terms of which the fields are expanded. In certain embodiments, the constants $\alpha_i$ and $\beta_i$ are related by:

$$\text{Re}(\alpha_i) = \text{Im}(\beta_i) = -C\frac{k_{ave}}{2p}, \quad \text{Im}(\alpha_i) = \text{Re}(\beta_i) = \frac{k_{ave}}{2p},$$

where $k_{ave}$ is an average wave number corresponding to the interface (i.e., a wave number averaged over the meshes of the discretized interface, which may have different material properties and, consequently, different wave numbers associated with them). Further, C is a constant dependent on the basis order of the finite elements, and p is a mesh-dependent constant that may be given by:

$$p = \sqrt{k_{max}} C_\omega^{1/4} \text{ with } k_{max} = s\frac{\pi}{h_{min}} \text{ and } C_\omega = \min(k_+^2 - k_{ave}^2, k_{ave}^2 - k_-^2),$$

where s is another basis-order-dependent constant, and $h_{min}$ is the smallest edge length of the mesh of the interface (and, accordingly, $k_{max}$ is the largest wave number supported by the interface mesh). The constants $k_+$ and $k_-$ relate to the two smallest side lengths a and b of the bounding box of $\Omega_i$ (which is a cuboid whose faces are each tangential to the surface of $\Omega_i$) according to:

$$k_- = \pi\sqrt{\frac{m_1^2}{a^2} + \frac{n_1^2}{b^2}} \text{ and } k_+ = \pi\sqrt{\frac{m_2^2}{a^2} + \frac{n_2^2}{b^2}},$$

where, $m_1, n_1, m_2,$ and $n_2$ are the smallest positive integers for which the following inequality holds:

$$\pi\sqrt{\frac{m_1^2}{a^2} + \frac{n_1^2}{b^2}} \leq k_{ave} \leq \pi\sqrt{\frac{m_2^2}{a^2} + \frac{n_2^2}{b^2}}.$$

As indicated, the constants C and s depend on the basis order of the finite elements. In preferred embodiments, if first-order and/or second-order basis functions are used, C=0.5 and s=0.5. If third-order basis functions are used, the constants are preferably chosen as C=0.25 and s=1.0.

Based on the mathematical model of the electromagnetic fields in the discretized user-defined domain (as described in the preceding paragraphs), a system matrix may be generated, and a corresponding system matrix equation may be derived using FEM. In one approach, the electric fields $\vec{E}_1$ and surface electric currents $\vec{j}_1$ are sought in curl-conforming subspaces of Hilbert spaces (as defined, for example, in Hiptmair, R. "Symmetric Coupling for Eddy Current Problems," SIAM J. Numer. Anal., vol. 40, no. 1, pp. 41-65 (2002), which is hereby incorporated herein by reference in its entirety), $$\vec{E}_1 \in H(\text{curl};\Omega_1) \text{ and } \vec{j}_1 \in H^{\perp-1/2}(\text{curl}_\Gamma;\Gamma_{12}),$$

such that:

$$b(\vec{v}_1,\vec{E}_1) - \langle \gamma_t\vec{v}_1,\vec{j}_1 \rangle_{\Gamma_{12}} = jk_0\eta(\vec{v}_1,\vec{j}_1^{imp})_{\Omega_1} \text{ for all } \vec{v}_1 \in H(\text{curl};\Omega_1) \quad (1),$$

where the tangential surface trace $\gamma_t$ is defined, for any vector by $\gamma_i \vec{u} = \vec{n} \times \vec{u} \times \vec{n}$, and the bilinear forms $b(\bullet,\bullet)_\Omega$, $\langle \bullet,\bullet \rangle_\Gamma$, and $(\bullet,\bullet)_\Omega$ are defined by:

$$b(\vec{v},\vec{u})_\Omega = \int_\Omega \left[(\nabla\times\vec{v})\cdot\frac{1}{\mu_r}(\nabla\times\vec{u})\right]dx^3 - k_0^2\int_\Omega(\vec{v}\cdot\varepsilon_r\vec{u})dx^3,$$

$$(\vec{v},\vec{u})_\Omega = \int_\Omega(\vec{v}\cdot\vec{u})dx^3, \text{ and}$$

$$\langle\vec{v},\vec{u}\rangle_\Gamma = \int_\Gamma(\vec{v},\vec{u})dx^2.$$

Appropriate testing functions for second-order Robin conditions are $\gamma_t\vec{v}_1 \in H_\perp^{-1/2}(\text{curl}_\Gamma,\Gamma_{12})$. Using these testing functions, we obtain, by exploiting the identity $\langle\vec{v},\text{curl}_\Gamma \text{curl}_\Gamma\vec{e}\rangle = \langle\text{curl}_\Gamma\vec{v},\text{curl}_\Gamma\vec{e}\rangle$ for close surfaces (i.e., for tetrahedral and triangular discrete domain elements):

$$\langle\gamma_t\vec{v}_1,\vec{j}_1\rangle_{\Gamma_{12}} + \langle\gamma t\vec{v}_1,A_1\vec{e}_1\rangle_{\Gamma_{12}} + \langle\text{curl}_\Gamma(\gamma_t\vec{v}_1),$$
$$B_1\text{curl}_\Gamma\vec{e}_1\rangle_{\Gamma_{12}} = \langle\gamma_t\vec{v}_1,\vec{j}_2\rangle_{\Gamma_{12}} +$$
$$\langle\gamma_t\vec{v}_1,A_1\vec{e}_2\rangle_{\Gamma_{12}} + \langle\text{curl}_\Gamma(\gamma_1\vec{v}_1),$$
$$B_1\text{curl}_\Gamma\vec{e}_2\rangle_{\Gamma_{12}} \qquad (2).$$

From the above equations, and analogous equations for the electric fields $\vec{E}_2$ and surface electric currents $\vec{j}_2$ in subdomain $\Omega_2$, the system matrix equation may be obtained:

$$\begin{bmatrix} K_1 & -G_{12} \\ -G_{21} & K_2 \end{bmatrix}\begin{bmatrix}\bar{u}_1 \\ \bar{u}_2\end{bmatrix} = \begin{bmatrix}\bar{y}_1 \\ \bar{y}_2\end{bmatrix}.$$

Herein, the diagonal blocks $K_i$ are submatrices corresponding to subdomains $\Omega_i$, and the off-diagonal blocks $-G_{ij}$ are submatrices corresponding to coupling between subdomains $\Omega_i$ and $\Omega_j$. The vectors $\bar{u}_i$ and $\bar{y}_i$ specify the physical fields and excitations, respectively:

$$\bar{u}_i = \begin{pmatrix}\bar{E}_i \\ \bar{e}_i \\ \bar{j}_i\end{pmatrix} \text{ and } \bar{y}_i = \begin{pmatrix}\bar{b}_i \\ 0 \\ 0\end{pmatrix}.$$

The submatrices $K_i$ and $G_{ij}$ are given by:

$$K_i = \begin{pmatrix} A_i & C_i & 0 \\ C_i^T & B_i + S_{ii} + T_{ii}^e & -T_{ii}^j \\ 0 & S_{ii} + T_{ii}^e & T_{ii}^j \end{pmatrix} \text{ and } G_{ij} = \begin{pmatrix} 0 & 0 & 0 \\ 0 & 0 & 0 \\ 0 & S_{ij} + T_{ij}^e & -T_{ij}^j \end{pmatrix},$$

wherein $S_{ij} = \langle\text{curl}_\Gamma(\gamma_t\vec{v}_i),B_i\text{curl}_\Gamma\vec{v}_j\rangle_{\Gamma_{ij}}$, $T_{ij}^j = \langle\gamma_t\vec{v}_i,\gamma_t\vec{v}_j\rangle_{\Gamma_{ij}}$, $T_{ij}^e = \langle\gamma_t\vec{v}_i,A_i\gamma_t\vec{v}_j\rangle_{\Gamma_{ij}}$. (Note that matrix components are to be computed not only for each combination of i and j, but also for each finite element of the field expansion.) The matrix sub-blocks $A_i$, $B_i$ and $C_i$ are traditional FEM matrices, well known to persons of skill in the art, which may be found, for example, in Lee, S. C. et al., "A Non-Overlapping Domain Decomposition Method with Non-Matching Grids for Modeling Large Finite Antenna Arrays," J. Comput. Phys., vol. 203, pp. 1-21 (February 2005), the entire disclosure of which is hereby incorporated herein by reference.

The blocks $K_i$ and $G_{ij}$ as defined above are non-symmetric. In problem formulations using first-order Robin transmission conditions, symmetric blocks can be accomplished via transformation, by splitting the surface integral of equation (1) into two halves, and replacing one half by an equivalent expression based on equation (2). This approach is, however, not generalizable to second-order Robin transmission conditions, i.e., it does not result in symmetric submatrix blocks. In various embodiments that utilize second-order Robin transmission conditions, therefore, another approach is used to simplify the system matrix: instead of splitting the surface integral of equation (1) (i.e., expression $\rangle\gamma_t\vec{v}_1,\vec{j}_1\rangle_{\Gamma_{12}}$), the entire surface integral is replaced by the corresponding terms in equation (2), i.e., by:

$$-\rangle\gamma_t\vec{v}_1,A_1\vec{e}_1\rangle_{\Gamma_{12}} - \rangle\text{curl}_\Gamma(\gamma_1\vec{v}_1),B_1\text{curl}_\Gamma\vec{e}_1\rangle$$
$$\Gamma_{12} - \rangle\gamma_1\vec{v}_1,\vec{j}_2\rangle_{\Gamma_{12}} + \rangle\gamma_1\vec{v}_1,A_1\vec{e}_2\rangle_{\Gamma_{12}} + \rangle\text{curl}_\Gamma$$
$$(\gamma_1\vec{v}_1),B_1\text{curl}_\Gamma\vec{e}_2\rangle_{\Gamma_{12}}.$$

As a result, the system matrix blocks take the following form:

$$K_i = \begin{pmatrix} A_i & C_i & 0 \\ C_i^T & B_i + S_{ii} + T_{ii}^e & 0 \\ 0 & S_{ii} + T_{ii}^e & T_{ii}^j \end{pmatrix}$$

and $$G_{ij} = \begin{pmatrix} 0 & 0 & 0 \\ 0 & S_{ij} + T_{ij}^e & -T_{ij}^j \\ 0 & S_{ij} + T_{ij}^e & -T_{ij}^j \end{pmatrix}.$$

While the subdomain matrices $K_i$ are still non-symmetric, they have block lower triangular form. Specifically, $K_i$ may be rewritten as:

$$K_i = \begin{bmatrix} K_{PP} & 0 \\ K_{DP} & K_{DD} \end{bmatrix},$$

where $$K_{PP} = \begin{bmatrix} A_i & C_i \\ C_i^T & B_i + S_{ii} + T_{ii}^e \end{bmatrix}, K_{DD} = T_{ii}^j,$$

and $K_{DP} = [0\ S_{ii}+T_{ii}^e]$. The sub-block $K_{PP}$ is symmetric and very similar to the system matrix of a traditional FEM approach (differing only in that it accounts for additional Robin interfaces), and the sub-block $K_{DD}$ is a real positive definite matrix whose dimension is much smaller than $K_{PP}$, and, thus, does not impose significant computational overhead.

As explained above, the iterative solution of the system matrix equation requires iterative computations of correction vectors $\bar{r}_i^{(n)} = K_i^{-1}G_{ij}\bar{u}_j^{(n-1)}$ and, thus, inversion of the subdomain matrices. The inverse of subdomain matrix $K_i$ is:

$$K_i^{-1} = \begin{bmatrix} K_{PP}^{-1} & 0 \\ -K_{DD}^{-1}K_{DP}K_{PP}^{-1} & K_{DD}^{-1} \end{bmatrix},$$

and its application to a vector $\bar{v}$ results in:

$$K_i^{-1}\bar{v} = \begin{bmatrix} K_{PP}^{-1} & 0 \\ -K_{DD}^{-1}K_{DP}K_{PP}^{-1} & K_{DD}^{-1} \end{bmatrix}\begin{bmatrix} \bar{v}_{PP} \\ \bar{v}_{DD} \end{bmatrix} = \begin{bmatrix} K_{PP}^{-1}\bar{v}_{PP} \\ K_{DD}^{-1}(\bar{v}_{DD} - K_{DP}K_{PP}^{-1}\bar{v}_{PP}) \end{bmatrix}.$$

As can be seen, any inverse operation of $K_i$ can, advantageously, be obtained through inverse operations of $K_{PP}$ and $K_{DD}$, resulting in smaller memory requirements than would be necessary if $K_i$ did not have block lower triangular form. The sub-blocks may be factorized into lower and upper triangular matrices L and U (an operation known to persons of skill in the art as "LU factorization"). While non-symmetric full factorized matrices require both L and U to be stored, the full information of $K_{PP}$ and $K_{DD}$ is, due to their symmetry, contained in either L or U, resulting in memory savings of about a factor of two.

2. Matrix Preconditioning with Modified Gauss-Seidel Preconditioners

As noted above with reference to FIG. 1, the convergence properties of an iterative solution method can often be improved by applying a preconditioner to the system matrix (steps 110 and 112). In the context of domain decomposition, this involves splitting a system matrix A into two matrices A=M−N, such that the system matrix equation $A\bar{x}=\bar{b}$ becomes $M\bar{x}=\bar{b}+N\bar{x}$. Starting with an initial guess $\bar{x}^{(0)}$, which is often set to zero, this equation can be solved iteratively according to:

$$\bar{x}^{(n+1)} = M^{-1}\bar{b} + M^{-1}N\bar{x}^{(n)} = M^{-1}(\bar{b}+M\bar{x}^{(n)}-A\bar{x}^{(n)}) = \bar{x}^{(n)} + M^{-1}(\bar{b}-A\bar{x}^{(n)}).$$

Thus, one of the major computations performed by an iterative solver is $M^{-1}A\bar{x}$. Defining the error vector (also referred to as "residual vector") $\bar{r}^{(n)} = \bar{b} - A\bar{x}^{(n)}$, the iterations may continue until a convergence criterion (or "termination condition")

$$\frac{\|\bar{r}^{(n)}\|}{\|\bar{b}\|} \leq \varepsilon,$$

where $\varepsilon$ is a user-defined error, is satisfied, indicating that $\bar{x}^{(n)}$ has converged to the correct solution. The matrix $M^{-1}$ is usually referred to as the preconditioner of the system matrix A, and its choice is critical to the convergence of the iterative process. For the iterative solver to converge, M and N are generally chosen such that the spectral radius of the preconditioner, $\rho(M^{-1}N)$, which is defined as the eigenvalue with the largest absolute value (i.e., distance from the origin), is smaller than one.

In domain decomposition methods, Jacobi and Gauss-Seidel preconditioners are frequently used. Consider, for example, the system matrix for a domain that is one-dimensionally partitioned into three subdomains in a manner such that interfaces exist between the first and second subdomains, and between the second and third subdomains, but not between the first and third subdomains:

$$K = \begin{bmatrix} K_1 & -G_{12} & 0 \\ -G_{21} & K_2 & -G_{23} \\ 0 & -G_{32} & K_3 \end{bmatrix}.$$

This matrix is sparse, i.e., it contains off-diagonal blocks that are zero, reflecting the fact that not every subdomain is coupled to every other subdomain. (In the example, the first and third subdomains are uncoupled, such that $G_{13}=0$.)

The Jacobi preconditioner of a matrix is, generally, the inverse of its diagonal terms (the diagonal terms being, in DDMs, the diagonal blocks). For the exemplary matrix above, the Jacobi preconditioner is:

$$M_J^{-1} = \begin{bmatrix} K_1^{-1} & 0 & 0 \\ 0 & K_2^{-1} & 0 \\ 0 & 0 & K_3^{-1} \end{bmatrix},$$

and the resulting Jacobi-preconditioned matrix is:

$$M_J^{-1}K = \begin{bmatrix} I & -K_1^{-1}G_{12} & 0 \\ -K_2^{-1}G_{21} & I & -K_2^{-1}G_{23} \\ 0 & -K_3^{-1}G_{32} & I \end{bmatrix}.$$

Due to the block-diagonal form of the Jacobi preconditioner, the iterations are inherently parallelizable, i.e., computations for the various subdomains can be carried out in parallel, reducing computation time.

The Gauss-Seidel preconditioner of a matrix is, generally, the inverse of its lower triangular part, which is, for the above exemplary matrix:

$$M_{GS}^{-1} = \begin{bmatrix} K_1 & 0 & 0 \\ -G_{12} & K_2 & 0 \\ 0 & -G_{32} & K_3 \end{bmatrix}^{-1}.$$

Figure 3:
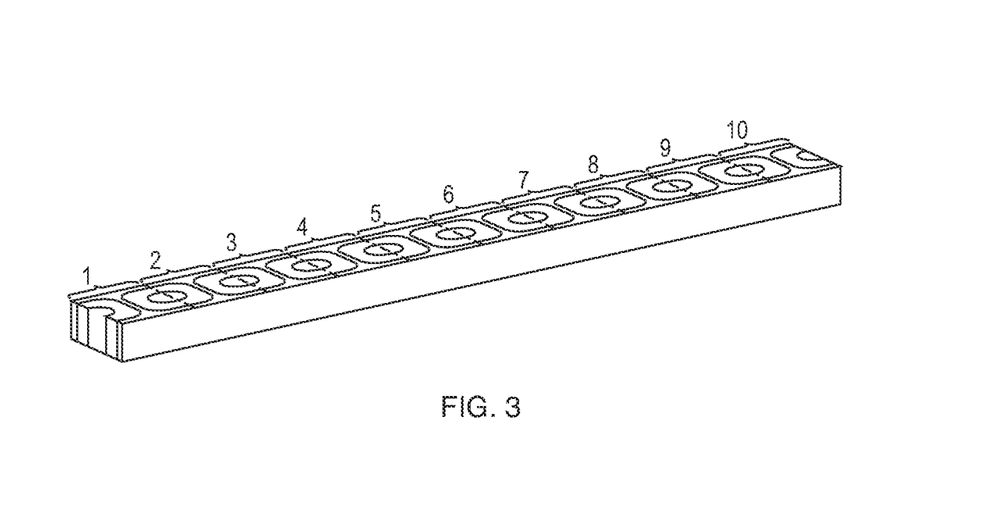
FIG. 3 is a schematic drawing of a rectangular waveguide domain divided into ten subdomains in accordance with one embodiment.

The convergence rate of Gauss-Seidel iterations is typically about twice that of Jacobi iterations. Moreover, using a Gauss-Seidel preconditioner, the convergence can be further improved by numbering the subdomains appropriately, e.g., in the order in which the wave front propagates. FIG. 3 illustrates, for example, a cuboid domain that is "sliced," i.e., linearly portioned, into ten adjacent subdomains. Assuming that a wave is excited on the left, the subdomains may be numbered from left to right. In general, the subdomains of any decomposition scheme are preferably numbered starting with the subdomain containing the excitation, followed by the adjacent subdomains (i.e., the "next neighbors" of the first subdomain), followed by the subdomains surrounding the neighbors (i.e., the "second neighbors" of the first subdomain), etc., until all subdomains are numbered. In contrast to Jacobi preconditioners, Gauss-Seidel preconditioners "respect" the subdomain ordering in the sense that their convergence rate generally depends on the ordering. In Jacobi iteration methods, the previous iteration's solution is used to update the current iteration's solution. However, for some subdomains, some neighboring subdomains may already have an updated solution, and Jacobi iterations fail to take advantage of this property. In Gauss-Seidel iteration methods, the most updated solution for each subdomain is used. Therefore, Gauss-Seidel methods are generally faster to converge, but domain-ordering dependent. For the same reason, Gauss-Seidel methods are sequential in nature.

In various embodiments of the present invention, the system matrix is preconditioned with a modified Gauss-Seidel preconditioner that combines the advantages of Gauss-Seidel and Jacobi preconditioners. The (exact) Gauss-Seidel-preconditioner can be factorized into the product of a Jacobi preconditioner of the system matrix, and a Gauss-Seidel preconditioner of the Jacobi-preconditioned matrix, resulting, after application to the system matrix, in:

$$M_{GS}^{-1}K = \begin{bmatrix} I & 0 & 0 \\ K_2^{-1}G_{21} & I & 0 \\ K_3^{-1}G_{32}K_2^{-1}G_{21} & K_3^{-1}G_{32} & I \end{bmatrix} \begin{bmatrix} I & -K_1^{-1}G_{12} & 0 \\ -K_2^{-1}G_{21} & I & -K_2^{-1}G_{23} \\ 0 & -K_3^{-1}G_{32} & I \end{bmatrix}.$$

The sequential nature of the Gauss-Seidel preconditioner results from the higher-order term $K_3^{-1}G_{32}K_2^{-1}G_{21}$. Therefore, by dropping this term, parallelizability can be maintained without significantly affecting convergence. Accordingly, various embodiments utilize a modified Gauss-Seidel preconditioner comprising two preconditioning steps:

$$\tilde{M}_{GS}^{-1}K = \begin{bmatrix} I & 0 & 0 \\ K_2^{-1}G_{21} & I & 0 \\ 0 & K_3^{-1}G_{32} & I \end{bmatrix} \begin{bmatrix} I & -K_1^{-1}G_{12} & 0 \\ -K_2^{-1}G_{21} & I & -K_2^{-1}G_{23} \\ 0 & -K_3^{-1}G_{32} & I \end{bmatrix}.$$

The modified Gauss-Seidel preconditioner can be readily generalized to an arbitrary number of subdomains. In the case of only two subdomains, the modified Gauss-Seidel preconditioner reduces identically to the Gauss-Seidel preconditioner. For four subdomains in a one-dimensional arrangement, the modified Gauss-Seidel preconditioner yields:

$$\tilde{M}_{GS}^{-1}K = \begin{bmatrix} I & 0 & 0 & 0 \\ K_2^{-1}G_{21} & I & 0 & 0 \\ 0 & K_3^{-1}G_{32} & I & 0 \\ 0 & 0 & K_4^{-1}G_{43} & I \end{bmatrix} \begin{bmatrix} I & -K_1^{-1}G_{12} & 0 & 0 \\ -K_2^{-1}G_{21} & I & -K_2^{-1}G_{23} & 0 \\ 0 & -K_3^{-1}G_{32} & I & -K_3^{-1}G_{34} \\ 0 & 0 & -K_4^{-1}G_{43} & I \end{bmatrix}.$$

For N subdomains, modified Gauss-Seidel preconditioning results in:

$$\tilde{M}_{GS}^{-1}K = \begin{bmatrix} I & 0 & 0 & 0 & 0 \\ -K_2^{-1}G_{21} & I & 0 & 0 & 0 \\ 0 & \ddots & I & 0 & 0 \\ 0 & 0 & -K_{n-1}^{-1}G_{n-1,n-2} & I & 0 \\ 0 & 0 & 0 & -K_n^{-1}G_{n,n-1} & I \end{bmatrix}$$

$$\begin{bmatrix} I & -K_1^{-1}G_{12} & 0 & 0 & 0 \\ -K_2^{-1}G_{21} & I & -K_2^{-1}G_{23} & 0 & 0 \\ 0 & \ddots & I & \ddots & 0 \\ 0 & 0 & -K_{n-1}^{-1}G_{n-1,n-2} & I & -K_{n-1}^{-1}G_{n-1,n} \\ 0 & 0 & 0 & -K_n^{-1}G_{n,n-1} & I \end{bmatrix}.$$

Further, while the examples set forth above illustrate only the case of one-dimensional partitioning of the domain, a modified Gauss-Seidel preconditioner may also be applied in conjunction with two- or higher-dimensional domain decomposition schemes, where a larger number of off-diagonal blocks are non-zero. In most such cases, the system matrix (and the resulting preconditioner) is still sparse because most of the subdomains interface with only a few of the other subdomains. Moreover, the blocks (i.e., the submatrices) themselves are typically sparse.

The modified Gauss-Seidel preconditioner may be applied to system matrices for electromagnetic simulations, e.g., the matrix formulation using second-order Robin transmission conditions described in section 1 above. However, the use of modified Gauss-Seidel preconditioners in accordance with various embodiments is in no way limited to that problem formulation, nor to electromagnetic simulations. Rather, a modified Gauss-Seidel preconditioner may, generally, be applied to any system matrix, whether it represents vector or scalar quantities. It may be particularly beneficial to formulations based on domain decomposition, which typically result in a spectral radius of the preconditioned matrix of less than one.

3. Simultaneous Solution for Multiple Excitations

In various embodiments, the system matrix equation (which may model any physical system, such as, e.g., an electromagnetic field) is solved using a type of Krylov subspace iterative solver. In general, Krylov solvers are advantageous in that they do not require preconditioning the matrix such that the spectral radius $\rho(M^{-1}N)$ corresponding to the preconditioner is less than one. Nonetheless, the convergence properties of a Krylov method may benefit from applying, for example, a modified Gauss-Seidel preconditioner in each step of the iterative solution process.

In certain Krylov iterative methods, the solution vector $\bar{x}$ is expressed in a subspace spanned by the Krylov vectors $\{\bar{p}^{(1)}, \bar{p}^{(2)}, \ldots, \bar{p}^{(n)}\}$:

$$\bar{x}^{(n)} = \sum_{i=1}^{n} c_i \bar{p}^{(i)},$$

where n is the number of the iteration. With each iteration, the dimensionality of the Krylov subspace increases by one, allowing a residual vector (also referred to as error vector) associated with the approximation to be reduced by its component along the newly added dimension of the subspace. In other words, the residual vector is successively projected into the space orthogonal to the Krylov subspace, which is diminished as new Krylov vectors are added. The coefficients $c_i$ can, in principle, be derived from the condition:

$$A \sum_{i=1}^{n} c_i \bar{p}^{(i)} = \bar{b},$$

which implies:

$$P^T A P \bar{c} = P^T \bar{b},$$

where $P = [\bar{p}^{(1)} \bar{p}^{(2)} \ldots \bar{p}^{(n)}]$ is a dense matrix, and $\bar{c} = [c_1 \, c_2 \ldots c_n]^T$ is a column vector. If the Krylov vectors are "A-conjugate," i.e., chosen such that $$\overline{p}^{(i)} A \overline{p}^{(j)} = \delta_{ij},$$

the coefficients are given by $\overline{c} = P^T \overline{b}$. An A-conjugate Krylov subspace may be built from the residual vectors $\overline{r}^{(i)}$ in each iteration using a modified Gram-Schmidt process, as is known to those of skill in the art.

In certain simulation problems, the solution of the matrix equation—i.e., the behavior of the physical system that is simulated—is sought for multiple excitations $\overline{b}_i$ ($i=1, 2, \ldots m$):

$$A^{N \times N} X^{N \times m} = B^{N \times m},$$

where m is the number of excitations, N is the number of unknowns, $B = [\overline{b}_1 \; \overline{b}_2 \ldots \overline{b}_m]$ is a matrix formed by the excitations, and $X = [\overline{x}_1 \; \overline{x}_2 \ldots \overline{x}_m]$ is the matrix of corresponding solution vectors. While this matrix equation can be solved by forming a Krylov subspace in which the corresponding solution vector is expressed for each excitation independently, it may be advantageous to take advantage of any overlap in the Krylov subspaces by creating a joint Krylov subspace for all excitations. Accordingly, in certain embodiments, the matrix equations for the excitations are solved simultaneously by using the Krylov vector generated in each iteration to update all of the solution vectors. Denoting the residual vectors as $R = [\overline{r}_1 \; \overline{r}_2 \ldots \overline{r}_m]$, with $\overline{r}_i = \overline{b}_i - A\overline{x}_i$, a residual error $\epsilon_i$ may be defined for each excitation i as the ratio between the norm of the residual vector and the norm of the excitation vector:

$$\varepsilon_i = \frac{\|\overline{r}_i\|_2}{\|\overline{b}_i\|_2}.$$

The method is adapted to correct, in each iteration, the solution vector corresponding to the largest residual error.

Figure 4:
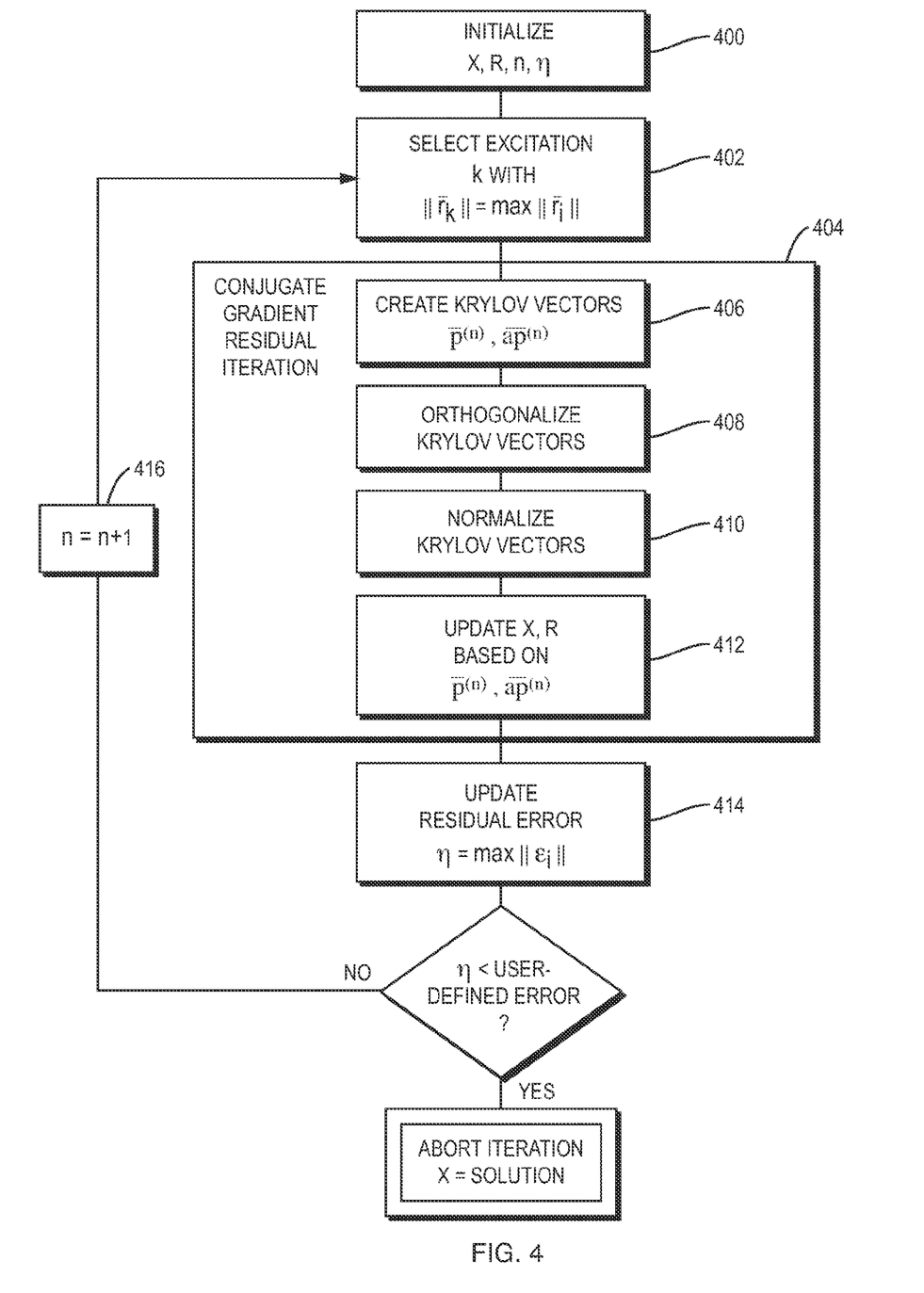
FIG. 4 is a flow chart illustrating a method for solving a matrix equation simultaneously for multiple excitations in accordance with various embodiments.

FIG. 4 illustrates the steps of an exemplary method for simulating a physical system (such as a physical field or network) simultaneously for multiple excitations. In a first step 400, the solution vectors are initialized (e.g., by setting X=0), the corresponding residual vectors are determined (resulting, for X=0, in R=B), and the iteration counter n is set equal to 1. (Optionally, the maximum residual error $\eta$ may be initialized, e.g., set to 1.0.) In step 402, the excitation index k that corresponds to the largest residual vector $$\|\overline{r}_k\| = \max_i \|\overline{r}_i\|_2 (i = 1, 2, \ldots m)$$

is identified. Then, a conjugate gradient residual (CGR) iteration is performed based on the selected excitation (step 404).

The CGR iteration involves, first (in step 406), generating a new Krylov vector $\overline{p}^{(n)}$ and an associated second Krylov vector $\overline{ap}^{(n)}$ according to:

$$\overline{p}^{(n)} = \frac{\overline{r}_k}{\|\overline{r}_k\|_2}$$

and $\overline{ap}^{(n)} = A\overline{r}_k$.

The Krylov subspaces $P = [\overline{p}^{(1)} \; \overline{p}^{(2)} \ldots \overline{p}^{(n)}]$ and $AP = [A\overline{p}^{(1)} \; A\overline{p}^{(2)} \ldots A\overline{p}^{(n)}]$ are accumulated during the iterative procedure, i.e., Krylov vectors created during previous iterations are "recycled" into subsequent iterations. To ensure linear independence of the vectors in each Krylov subspace, a modified Gram-Schmidt procedure is applied to newly generated Krylov vectors (step 408), i.e., the new Krylov vectors $\overline{p}^{(n)}$ and $\overline{ap}^{(n)}$ are orthogonalized with respect to all of the previously accumulated Krylov vector $\overline{p}^{(i)}$ and $\overline{ap}^{(i)}$ for $i = 1 \ldots n-1$:

$$\alpha = ap^{(i)H} ap^{(n)}, \; \overline{p}^{(n)} = \overline{p}^{(n)} - \alpha \overline{ap}^{(i)}, \text{ and } \overline{ap}^{(n)} - \alpha \overline{ap}^{(i)},$$

Where the superscript "H" denotes the conjugate transpose. Then, in step 410, the new Krylov vectors are normalized, e.g., by setting:

$$\overline{p}^{(n)} = \frac{\overline{p}^{(n)}}{\|\overline{ap}^{(n)}\|}$$

and $$\overline{ap}^{(n)} = \frac{\overline{ap}^{(n)}}{\|\overline{ap}^{(n)}\|}.$$

Finally, in step 412, the solution vectors $\overline{x}_i$ and associated residual vectors $\overline{r}_i$ are updated for all excitations (i.e., for $i = 1 \ldots m$) based on the new Krylov vectors:

$$\beta = \overline{ap}^{(n)H} \overline{r}_i, \overline{x}_i = \overline{x}_i + \beta \overline{p}^{(n)}, \text{ and } \overline{r}_i = \overline{r}_i - \beta \overline{ap}_n.$$

Following the CGR iteration, in step 414, the maximum residual error is updated:

$$\eta = \max_i (\varepsilon_i).$$

If the maximum residual error is less than a user-defined error threshold, the iterative procedure is aborted; otherwise, the iteration counter is n incremented (i.e., n=n+1) (step 416), and steps 402-414 are repeated for a new excitation index k corresponding to the then largest residual vector. When the maximum residual error $\eta$ falls below the user-defined threshold, the iterative process is terminated, and the approximated solution vectors are considered the desired solution. In some (but not all) cases, the approximated solution vectors converge to the exact solution.

The adaptive Krylov iterative recycling technique illustrated in FIG. 4 has a number of advantageous properties. It solves the matrix equation for all right-hand sides (i.e., excitations) simultaneously, processing in each iteration the most "difficult" right-hand side, i.e., the one corresponding to the largest residual error. The successively built-up Krylov spaces are reused and shared among all right-hand sides. By applying only one CGR iteration at a time for a selected right-hand side, the overall time for obtaining solution for all right-hand sides is reduced (compared with methods in which a Krylov technique solves the equations for multiple excitations independently). Further, Krylov vectors spanning the Krylov subspaces are, due the orthogonalization step, linearly independent, which avoids break-down of the iterative procedure.

The above-described method for simultaneously solving the matrix equation for multiple excitations is particularly effective if the right-hand sides are linearly dependent, as is the case, for example, in monostatic radar cross section (RCS) applications. However, the method is generally applicable to any matrix equation with multiple right-hand sides. In some applications, the accumulation of the Krylov subspaces imposes large memory requirements. The size of the Krylov subspaces, and the resulting memory requirements, may, however, be reduced in certain embodiments by using domain-decomposition formulations with second-order Robin transmission conditions and/or applying a modified Gauss-Seidel preconditioner to the system matrix.

4. Computer System for Simulating Physical Fields and Networks

Figure 5:
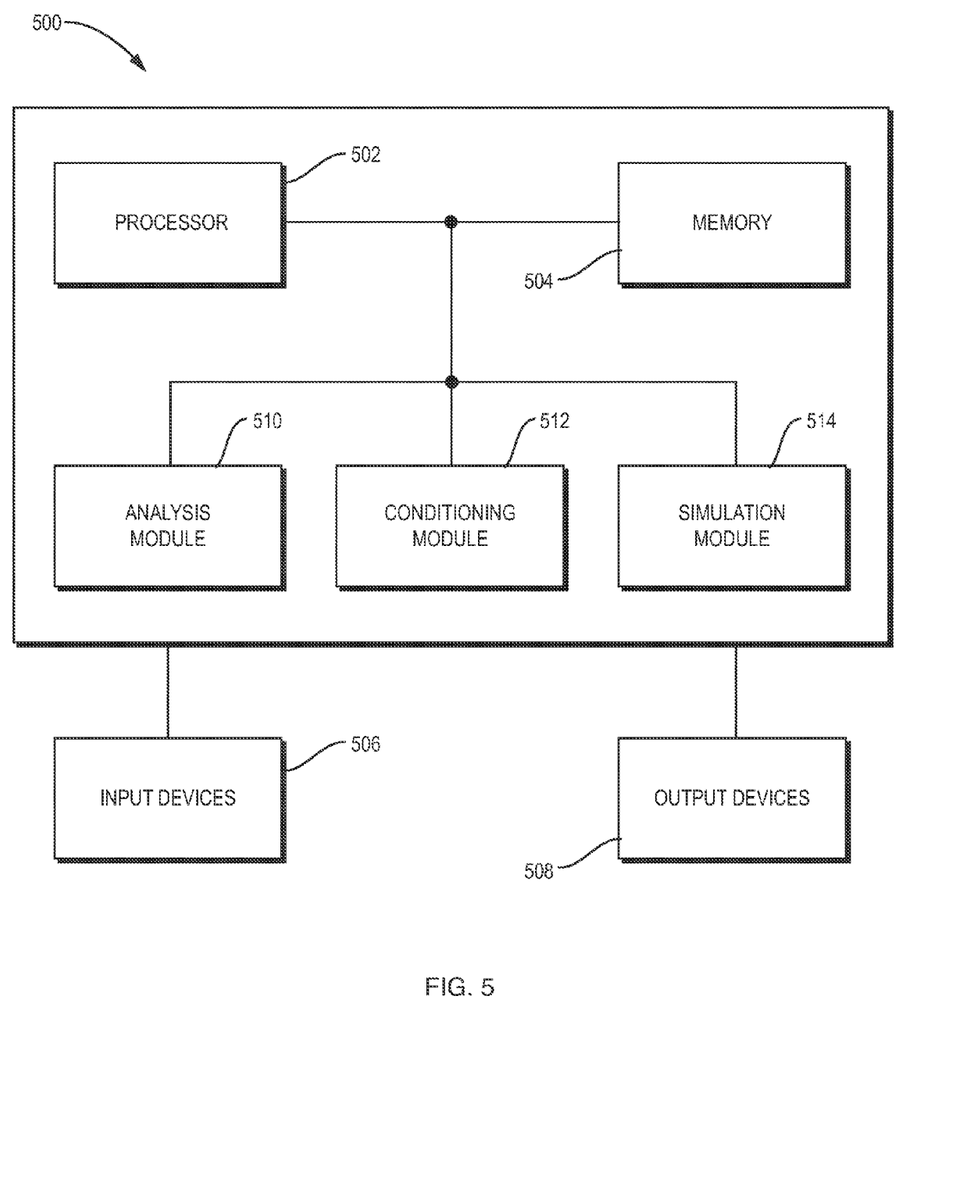
FIG. 5 is a block diagram of a system implementing simulation methods in accordance with various embodiments.

The above-described methods for simulating physical systems (such as, e.g., electromagnetic fields) may be implemented in a computer system (e.g., on a general-purpose computer furnished with suitable software) or, more generally, with hardware, software, or a combination of both. An exemplary system 500 is illustrated in FIG. 5 in block-diagram form. The system 500 includes a processing unit 502 (e.g., a conventional microprocessor) in communication with a main system memory 504 (typically a volatile random-access memory). A partition of the memory 504 stores parameters representative of the physical system to be simulated (e.g., parameters representative of a user-defined domain and a physical field simulated therein). In various embodiments, a user may provide certain such parameters via one or more input devices 506. For example, the user may specify the boundaries and material properties of the user-defined domain, and/or select the types of fields (e.g., electrical, magnetic, temperature, pressure, etc.) to be simulated. The system 500 may also include output devices 508, such as screen displays or printers. An screen display may, for example, render a graphical representation of a physical object, a user-defined domain of the object, and a physical field simulated within the domain. Properties of the field, such as field amplitude and/or phases may, for example, be represented in a color-coded map.

The system 500 further includes executable instructions, some of which are conceptually illustrated as a group of modules, that control the operation of the processing unit 502 and its interaction with the other hardware components. Some of these modules carry out the modeling and simulation techniques described above. In particular, an analysis module 510 models the physical system to be simulated, e.g., by generating a system of equations (or a matrix equation) that describe the behavior of the system. The modeling may be based on user-provided parameters of the system stored in the memory partition. In some embodiments involving simulations of physical fields in a user-defined domain, the analysis module partitions the domain into multiple subdomains, and models the fields within the subdomain with a block system matrix. For electromagnetic fields, the system matrix may be created using second-order (or higher-order) Robin transmission conditions selected as described earlier. The system may further include a conditioning module 512 that preconditions the matrix for subsequent iterative solution. The conditioning module may apply a pre-determined preconditioner, or facilitate user selection from among several preconditioners (including, e.g., Jacobi preconditioners, Gauss-Seidel preconditioners, and modified Gauss-Seidel preconditioners). A simulation module (or iterative solver) 514, finally, facilitates iterative solution of the system matrix equation. The simulation module 514 may be adapted to solve a matrix equation for multiple right-hand sides simultaneously, using, e.g., an adapted Krylov iterative recycling algorithm as detailed earlier. A graphics module (not shown) in communication with the analysis, conditioning, and/or simulation modules may serve to render a physical object, system, or field subject to simulation on a display or other output device 508.

As noted, the modules 510, 512, 514 may be realized as software instructions which are, in operation, stored in memory 504. The software may be written in any one of a number of high level languages such as C, C++, C#, CUDA, OpenCL, FORTRAN, PASCAL, JAVA, LISP, PERL, BASIC or any suitable programming language. Alternatively, the software may be implemented in an assembly language and/or machine language directed to a microprocessor or specialized high-performance computational hardware, such as a GPU, resident on a target device. In still other implementations, various of the operations attributed to one or more of the modules 510, 512, 514 are carried out by dedicated hardware circuitry (e.g., a field-programmable gate array (FPGA) or application-specific integrated circuit (ASIC)).

5. Exemplary Applications

Figure 6A:
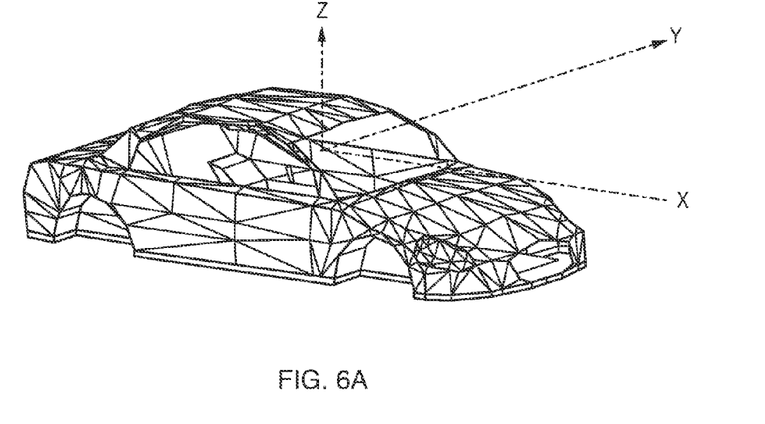
FIG. 6A is a user-defined domain representing a car body in accordance with one embodiment.
Figure 6B:
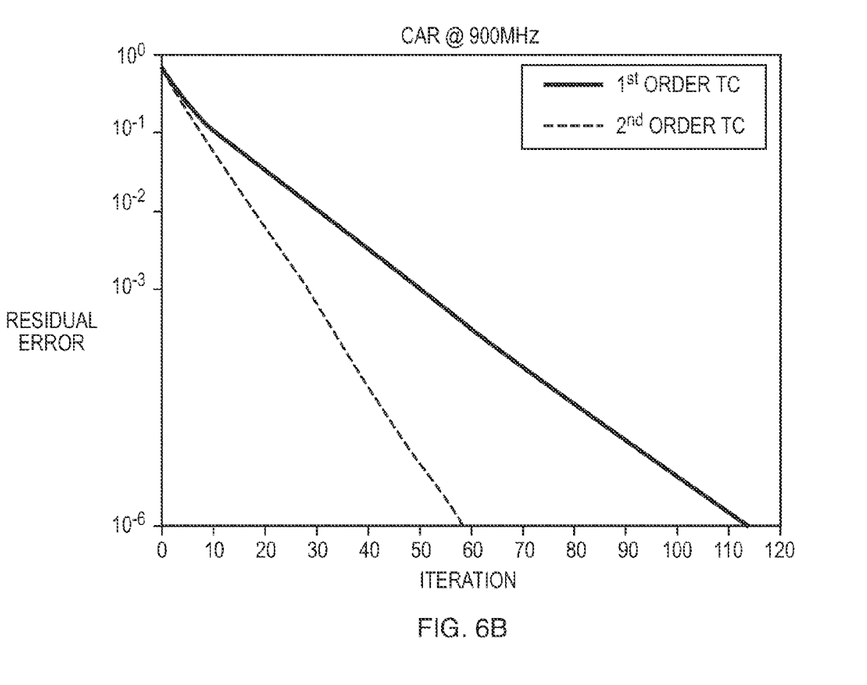
FIG. 6B is a graph illustrating the convergence of simulations of electromagnetic fields in the user-defined domain of FIG. 6A for second-order Robin transmission conditions in accordance with one embodiment, compared with second-order Robin transmission conditions.

Simulation methods in accordance with various embodiments may be used to simulate physical fields (or physical networks) for a number of practical applications. In certain embodiments, they provide performance enhancements such as, e.g., convergence rates that are increased by a factor of about two or more when compared with conventional simulation methods. FIGS. 6A and 6B illustrate an exemplary application of methods for simulating an electromagnetic field in a user-defined domain. FIG. 6A shows the user-defined domain—the body of a car—discretized into triangular elements. The domain is divided into four subdomains. A cell phone inside the car generates an electromagnetic field at a frequency of 900 MHz. FIG. 6B illustrates the convergence rate of the problem by plotting the residual error (i.e., the ratio of the magnitude of the residual vector and the excitation vector) as a function of the number of iterations. The dashed line represents the convergence resulting from a problem formulation that uses, in accordance with one embodiment, second-order Robin transmission conditions. For comparison, the solid line illustrates the convergence of a convention problem formulation with first-order Robin transmission conditions. As can be seen, second-order transmission conditions increase the convergence rate by about a factor of two.

Figure 7A:
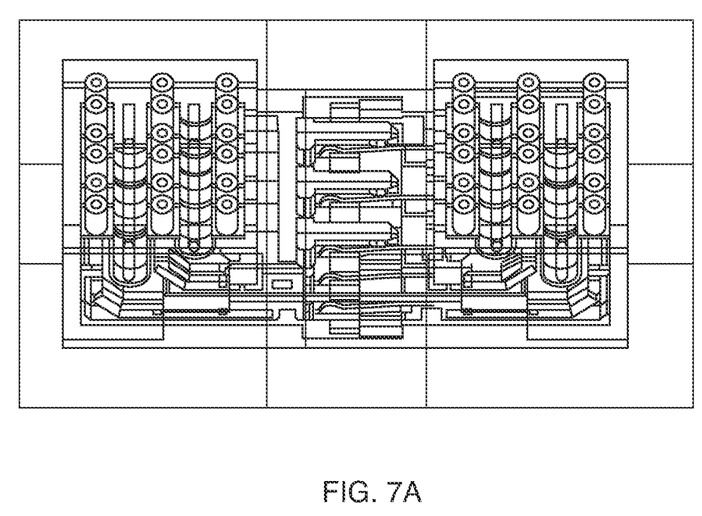
FIG. 7A is a user-defined domain representing an electronic circuit connector structure in accordance with one embodiment.
Figure 7B:
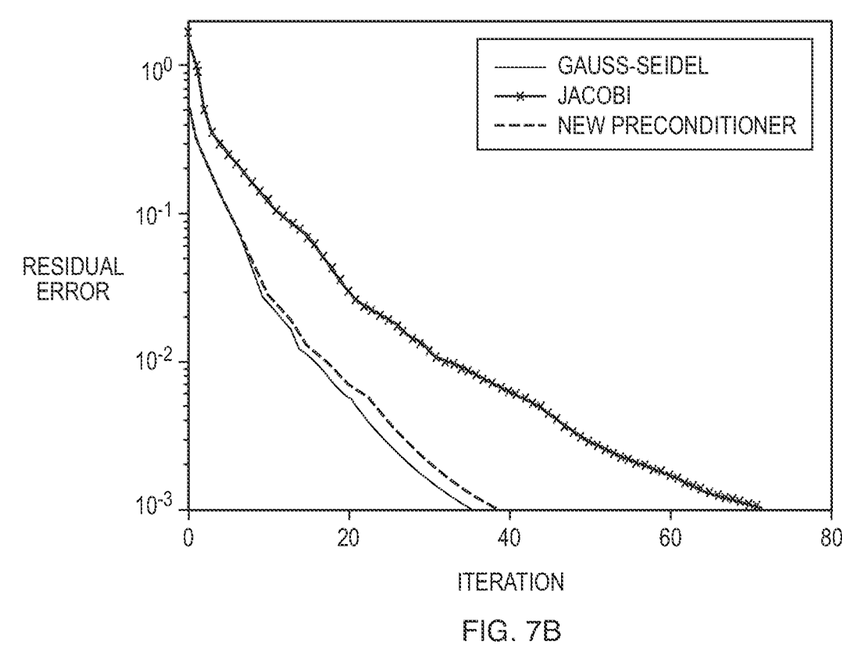
FIG. 7B is a graph illustrating the convergence of simulations of electromagnetic fields in the user-defined domain of FIG. 7A for modified Gauss-Seidel preconditioning in accordance with one embodiment, compared with conventional Jacobi and Gauss-Seidel preconditioning.

FIGS. 7A and 7B illustrate electromagnetic simulations of an electronic circuit connector structure. The structure itself, which constitutes the user-defined domain is shown in FIG. 7A. For the purpose of simulation, the domain is portioned into eight subdomains. FIG. 7B compares the convergence rate of the simulation for various preconditioners. Jacobi-preconditioning results in the slowest convergence; Gauss-Seidel preconditioning is about 1.8 times faster. As illustrated by the dashed line, a modified Gauss-Seidel preconditioner in accordance with one embodiment (which retains the parallelizability achieved with a Jacobi preconditioner) results in a convergence rate close to that obtained by conventional Gauss-Seidel preconditioning.

Although the present invention has been described with reference to specific details, it is not intended that such details should be regarded as limitations upon the scope of the invention, except as and to the extent that they are included in the accompanying claims.

What is claimed is:

1. A computer-implemented method for simulating physical properties of an electromagnetic field in a user-defined domain, the method comprising:

storing a user-defined domain in a memory;

decomposing, with a processor, the user-defined domain into a plurality of subdomains;

modeling the electromagnetic field within the plurality of subdomains, using higher-order Robin transmission conditions at interfaces between the subdomains; and computationally simulating the physical properties of the electromagnetic field in the domain based on the model, wherein the higher-order Robin transmission conditions comprise Robin coefficients that cause the simulated electromagnetic field to converge faster than a simulation based solely on first-order Robin conditions; and wherein the Robin coefficients are selected based on, at least in part: (i) a basis order of finite elements defined over a mesh grid of at least one subdomain, and (ii) constants related to two smallest side lengths of a bounding box of the user-defined domain.

2. The method of claim 1, wherein the Robin transmission conditions are second-order conditions.

3. The method of claim 1, wherein the Robin coefficients are selected based, at least in part, on a material property associated with the interfaces.

4. The method of claim 1, wherein the Robin coefficients are selected based, at least in part, on a free-space wave number of the electromagnetic fields.

5. The method of claim 1, wherein modeling the electromagnetic field comprises generating a block system matrix.

6. The method of claim 5, wherein generating the block system matrix comprises discretizing a variational form of the model using finite elements defined over mesh grids of the subdomains.

7. The method of claim 6, wherein the Robin coefficients are selected based, at least in part, on the discretization.

8. The method of claim 6, wherein the Robin coefficients scale with a mesh size of the at least one mesh grid.

9. The method of claim 6, wherein the finite elements are selected from the group of firstorder and second-order basis functions, and wherein first and second basis-order-dependent constants of the Robin coefficients are each selected to be within ±10% of 0.5.

10. The method of claim 6, wherein the finite elements are third-order basis functions, and wherein a first basis-order-dependent constant of the Robin coefficients is selected to be within ±10% of 0.25 and a second basis-order-dependent constant of the Robin coefficients is selected to be within ±10% of 1.0.

11. The method of claim 5, wherein simulating the electromagnetic field includes iteratively solving an equation comprising the block system matrix.

12. The method of claim 11, wherein simulating the electromagnetic field further comprises applying a modified Gauss-Seidel preconditioner to the block system matrix before solving the equation.

13. The method of claim 11, wherein iteratively solving the equation comprises solving, in parallel, matrix equations for the subdomains, each of the matrix equations comprising the diagonal block matrix corresponding to the respective subdomain.

14. The method of claim 1, wherein each diagonal block of the block system matrix has block lower triangular form.

15. The method of claim 1, further comprising graphically representing the simulated electromagnetic field on a display.

16. A computer-implemented method for simulating physical properties of an electromagnetic field in a user-defined domain, the method comprising:
storing a user-defined domain in a memory;
decomposing, with a processor, the user-defined domain into a plurality of subdomains; modeling the electromagnetic field within the plurality of subdomains;
based on the model, generating a block system matrix whose diagonal blocks correspond to the subdomains, each diagonal block having block lower triangular form; and
based at least in part on the block system matrix, computationally simulating the physical properties of the electromagnetic field wherein generating the block system matrix comprises using Robin transmission conditions comprising Robin coefficients,
wherein the Robin coefficients are selected based on, at least in part, constants related to two smallest side lengths of a bounding box of the user-defined domain.

17. The method of claim 16, wherein generating the block system matrix comprises discretizing a variational form of the model using finite elements defined over mesh grids of the subdomains.

18. The method of claim 17, wherein generating the block system matrix comprises substituting a surface integral in the variational form using Robin transmission conditions.

19. The method of claim 16, further comprising graphically representing the simulated electromagnetic field on a display.

20. A computer system for simulating physical properties of an electromagnetic field in a user-defined domain, the system comprising:
a computer containing
(a) a memory for storing parameters representative of the electromagnetic field and the user- defined domain; and
(b) an analysis module for:
decomposing the user-defined domain into a plurality of subdomains;
modeling the electromagnetic field within the plurality of subdomains, using higher-order Robin transmission conditions at interfaces between the subdomains; and
(c) a simulation module for simulating the physical properties of the electromagnetic field based at least in part on the block system matrix,
wherein the higher-order Robin transmission conditions comprise Robin coefficients that cause the simulated electromagnetic field to converge faster than a simulation based solely on first-order Robin conditions, and
wherein the Robin coefficients are selected based on, at least in part: (i) a basis order of finite elements defined over a mesh grid of at least one subdomains, and (ii) constants related to two smallest side lengths of a bounding box of the user-defined domain.

21. A computer system for simulating physical properties of an electromagnetic field in a user-defined domain, the system comprising:
a computer containing
(a) a memory for storing parameters representative of the electromagnetic field and the user-defined domain; and
(b) an analysis module for:
decomposing the user-defined domain into a plurality of subdomains; modeling the electromagnetic field within the plurality of subdomains;
generating, based on the model, a block system matrix system matrix whose diagonal blocks correspond to the subdomains, each diagonal block having block lower triangular form; and
(c) a simulation module for simulating the physical properties of the electromagnetic field based at least in part on the block system matrix,
wherein generating the block system matrix comprises using Robin transmission conditions comprising Robin coefficients,
wherein the Robin coefficients are selected based on, at least in part, constants related to two smallest side lengths of a bounding box of the user-defined domain.

* * * * *